United States Patent
Hopf et al.

(10) Patent No.: US 6,402,219 B1
(45) Date of Patent: Jun. 11, 2002

(54) ELECTRONIC APPARATUS HAVING A VIBRATION-SENSITIVE CONSTRUCTIONAL UNIT

(75) Inventors: Christian Hopf, Wetzlar; Norbert Kunze, Diez; Stefan Müller, Wetzlar; Horst Rumpf, Herborn; Cornelius Wouters, Asslar, all of (DE)

(73) Assignee: Koninklijke Philips Electronics N.V. (NL)

( * ) Notice: Subject to any disclaimer, the term of this patent is extended or adjusted under 35 U.S.C. 154(b) by 0 days.

(21) Appl. No.: 09/320,815

(22) Filed: May 27, 1999

(30) Foreign Application Priority Data

May 30, 1998 (DE) .......................... 198 24 378

(51) Int. Cl.$^7$ .......................... G11B 33/08; B60G 11/14; F16F 1/04

(52) U.S. Cl. ...................... 296/70; 296/37.12; 248/638; 248/565; 248/636; 369/247; 369/263; 267/288; 267/140.5

(58) Field of Search ................ 296/70, 37.12, 296/37.8; 248/638, 605, 565, 636; 369/75.1, 258, 247, 263; 267/288, 166.1, 140.5

(56) References Cited

U.S. PATENT DOCUMENTS

| | | | | |
|---|---|---|---|---|
| 2,270,335 A | * | 1/1942 | Parkinson et al. | 267/140.2 |
| 2,605,099 A | * | 7/1952 | Brown | 267/33 |
| 3,531,069 A | * | 9/1970 | Dubberley | 248/565 |
| 3,608,883 A | * | 9/1971 | Russold et al. | 367/152 |
| 3,713,516 A | * | 1/1973 | Freyler | 188/129 |
| 3,727,902 A | * | 4/1973 | Burckhardt et al. | 267/180 |
| 3,895,586 A | * | 7/1975 | Willetts | 369/247 |
| 4,077,619 A | * | 3/1978 | Boringhaus | 267/166 |
| 4,111,407 A | * | 9/1978 | Stager | 267/166 |
| 4,120,489 A | * | 10/1978 | Boringhaus | 267/61 R |
| 4,166,611 A | * | 9/1979 | Geers et al. | 267/3 |
| 4,190,239 A | * | 2/1980 | Schwankhart | 269/65 R |
| 4,223,955 A | * | 9/1980 | Reinecke | 303/22 R |
| 4,323,801 A | * | 4/1982 | Weghaupt et al. | 310/52 |
| 4,633,973 A | * | 1/1987 | Kitano | 181/207 |
| 4,810,231 A | * | 3/1989 | Weissenberger et al. | 464/68 |
| 4,846,382 A | * | 7/1989 | Foultner et al. | 296/37.12 |
| 4,869,471 A | * | 9/1989 | Schwarz et al. | 267/33 |
| 4,922,478 A | * | 5/1990 | Verhagen | 267/3 |
| 4,955,578 A | * | 9/1990 | Fidi | 248/559 |
| 4,957,277 A | * | 9/1990 | Paton | 267/33 |
| 5,042,024 A | * | 8/1991 | Kurosawa et al. | 369/75.1 |
| RE33,696 E | * | 9/1991 | Stevenson | 267/33 |
| 5,088,571 A | * | 2/1992 | Burry et al. | 296/70 |
| 5,088,580 A | * | 2/1992 | Grothe et al. | 188/298 |
| 5,102,181 A | * | 4/1992 | Pinkney | 296/37.12 |
| 5,282,556 A | * | 2/1994 | Bossert | 296/37.8 |
| 5,344,116 A | * | 9/1994 | Winkler | 248/677 |
| 5,347,507 A | * | 9/1994 | Kuhn | 369/263 |
| 5,386,962 A | * | 2/1995 | Adriance et al. | 248/624 |
| 5,425,531 A | * | 6/1995 | Perrault | 267/180 |
| 5,779,197 A | * | 7/1998 | Kim | 296/70 |
| 5,864,533 A | * | 1/1999 | Yamada et al. | 369/247 |
| 5,875,567 A | * | 3/1999 | Bayley | 36/27 |
| 5,878,998 A | * | 3/1999 | Hsieh | 267/166.1 |
| 6,193,225 B1 | * | 2/2001 | Watanabe | 267/180 |

FOREIGN PATENT DOCUMENTS

| | | | | |
|---|---|---|---|---|
| DE | 3914303 A1 | | 10/1990 | ........... G11B/33/08 |
| EP | 0278323 | * | 8/1988 | |
| JP | 63-261593 | * | 10/1998 | ............. 369/247 |

* cited by examiner

Primary Examiner—Stephen T. Gordon
Assistant Examiner—Hilary Gutman
(74) Attorney, Agent, or Firm—Dicran Halajian

(57) ABSTRACT

An electronic apparatus has a vibration-sensitive constructional unit accommodated in a housing, the housing and the vibration-sensitive constructional unit being coupled by damping apparatus. In order to reduce the vibration clearance of the vibration-sensitive constructional unit the damping apparatus includes at least one spring arrangement having a spring characteristic which is progressive in all three directions in space.

24 Claims, 1 Drawing Sheet

ELECTRONIC APPARATUS HAVING A VIBRATION-SENSITIVE CONSTRUCTIONAL UNIT

BACKGROUND OF THE INVENTION

This invention relates to an electronic apparatus having a vibration-sensitive constructional unit accommodated in a housing, the housing and the vibration-sensitive constructional unit being coupled by damping means.

Such an electronic unit is known, for example, from DE 39 14 303 A1. This known apparatus uses helical springs with a linear spring-force characteristic in order to provide isolation from external vibrations and shocks between the apparatus chassis or deck and the mounting structure or housing of the apparatus. The vibration amplitude of such helical springs for excitation by vibrations of comparatively low frequency is larger than for excitation by vibrations of comparatively high frequency. In such apparatuses the vibration clearance for the vibration-sensitive constructional unit should therefore be adapted to the lowest excitation frequencies that occur in operation.

SUMMARY OF THE INVENTION

It is an object of the invention to provide an apparatus of the type defined in the opening paragraph, wherein the vibration clearance required for the vibration-sensitive constructional unit is reduced.

According to the invention this object is achieved in that the damping means comprise at least one spring arrangement having a spring characteristic which is progressive in three directions in space.

In the usual case, the length of a compressed spring is shortened proportionally to the force which is applied to the spring e.g. if the force is doubled the length of the spring is halved. According to Applicants' invention, a progressive spring characteristic results in a spring that is shortened other than proportionally, e.g. if the compressive force is doubled the length of the spring is not reduced in half, for example, less than half.

A progressive spring characteristic means that the spring force increases progressively as the vibration amplitude or spring travel increases. When a spring vibrates, the difference between the shortest and the longest extension of the spring is called vibration amplitude. The spring characteristic, which is progressive in three directions in space, results in a progressive damping of vibrations in all three directions in space. The three directions in space are defined as directions in space of a Cartesian coordinate system. One axis of this Cartesian coordinate system is then preferably oriented in the direction of the longitudinal axis of the spring arrangement. Thus, vibrations that occur are damped progressively in three dimensions.

The vibration amplitude of the low-frequency vibrations is reduced as a result of the nonlinear tuning of the springs with progressive spring characteristics. This results in a reduction of the vibration clearance required for the vibration-sensitive constructional unit in all three directions in space and, consequently, of the construction volume of the electronic apparatus in all three directions in space.

In one advantageous embodiment of the invention the spring arrangement comprises a helical spring with non-linearly spaced turns. This non-linear spacing results in a non-linear spring characteristic of the helical spring which is progressive in the axial direction of the helical spring. A spring core is arranged inside the helical spring and the radial clearance between the turns of the helical spring and the spring core is not constant. Thus, it is achieved that as the vibration amplitude increases an increasing number of turns of the helical spring come into contact with the spring core, as a result of which the vibrations are damped progressively with increasing vibration amplitude and a spring characteristic is obtained which is progressive in space directions which extend radially with respect to the helical spring. Preferably, the spring core comprises a tapered non-elastic body.

In another advantageous embodiment of the invention the spring core is fixedly connected to the housing. The radial clearance between the turns of the helical spring and the spring core increases from the housing towards the vibration-sensitive constructional unit, i.e. near the housing the clearance between the turns of the helical spring and the spring core is comparatively small, while near the vibration-sensitive constructional unit it is comparatively large. Therefore, when the vibration-sensitive constructional unit is subjected to vibrations the helical spring, as the vibration amplitude increases, first comes into contact with the part of the spring core situated near the housing. When the vibration amplitude increases further an increasing number of turns of the helical spring come into contact with the spring core, which results in a spring characteristic which is progressive in space directions oriented radially with respect to the helical spring and, consequently, in a progressive damping of the vibration amplitude.

In a further advantageous embodiment the spring core is connected to the vibration-sensitive constructional unit and, consequently, vibrates along with the vibration-sensitive constructional unit. The radial clearance between the turns of the helical spring and the spring core in the present embodiment decreases from the housing towards the vibration-sensitive constructional unit, i.e. near the vibration-sensitive constructional unit the clearance between the turns of the helical spring and the spring core is comparatively small, while it is comparatively large near the housing. Therefore, when the vibration-sensitive constructional unit is subjected to vibrations and the vibration amplitude increases, only the turns of the helical spring situated near the vibration-sensitive constructional unit come initially into contact with the spring core. When the vibration amplitude increases further an increasing number of turns of the helical spring come into contact with the spring core, which results in a spring characteristic which is progressive in a radial direction and, consequently, in a progressive damping of the vibration amplitudes of the vibration-sensitive constructional unit.

The embodiments of the electronic apparatus in accordance with the invention are suitable for use in apparatuses for playing back or inscribing optical storage discs, such as for example CDs or DVDs. The electronic apparatus in accordance with the invention is particularly suitable for mounting in motor vehicles because the mounting room in motor vehicles is limited and numerous vibrations of different frequencies occur during the ride.

BRIEF DESCRIPTION OF THE DRAWING

Some embodiments of the invention will be described in more detail, by way of example, with reference to FIGS. 1 to 4 of the drawing. In the drawing.

DESCRIPTION OF THE PREFERRED EMBODIMENTS

Figure 1:
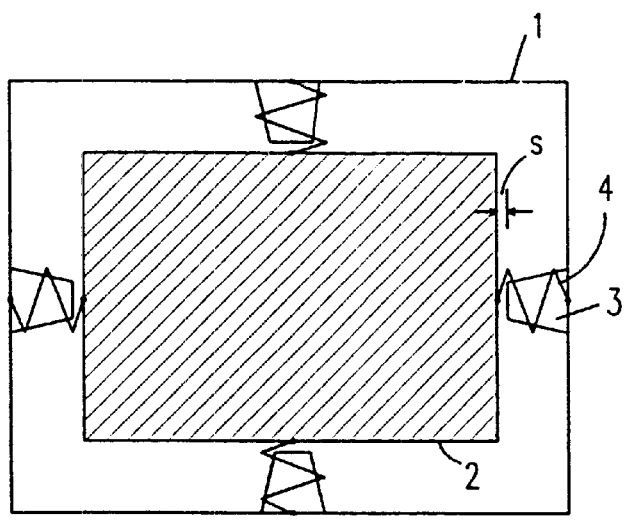
FIG. 1 is a plan view of an electronic apparatus having a vibration-sensitive constructional unit which is coupled to the housing of the electronic apparatus by means of four spring arrangements.

FIG. 1 is a plan view of an electronic apparatus having a housing 1, which accommodates a vibration-sensitive constructional unit 2. The vibration-sensitive constructional unit 2 is coupled to the housing 1 by means of four spring arrangements 3. The spring arrangements 3 each comprise a cylindrical helical spring 4. The cylindrical helical springs 4 have non-linearly spaced turns, as a result of which progressive spring characteristics are obtained in the directions of the longitudinal axes of the cylindrical helical springs 4. A progressive spring characteristic means that the spring force increases by a greater percentage than the percentage increase of the vibration amplitude of the spring. The cylindrical helical springs 4 each have one end secured to the housing 1 and another end to the vibration-sensitive constructional unit 2. A conical spring core is fixedly connected to the housing 1. The free end of the conical spring core 5 is slightly spaced from the vibration-sensitive constructional unit 2, as a result of which a vibration clearance S is available for the vibration-sensitive constructional unit 2. The spring arrangements 3 serve to provide isolation from external vibrations and/or shocks between the housing 1 and the vibration-sensitive constructional unit 2.

Figure 2:
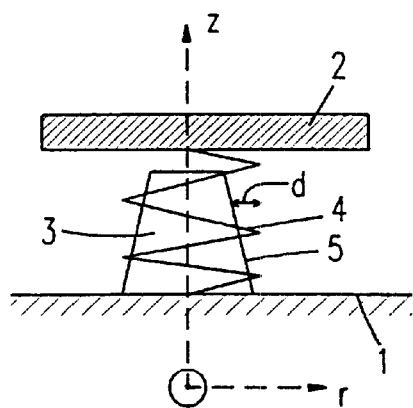
FIG. 2 shows a spring arrangement comprising a cylindrical helical spring having non-linearly spaced turns, a conical spring core secured to the housing being disposed inside the cylindrical helical spring.

FIG. 2 shows the spring arrangements 3 arranged between the housing 1 and the vibration-sensitive constructional unit 2 to an enlarged scale. The individual turns of the cylindrical helical spring 4 are spaced apart non-linearly. In the present example the spacing between the turns in a central portion of the helical spring 4 is larger than in the end portions of the helical spring 4. As a result of this, a progressive spring characteristic is obtained in the direction of the longitudinal axis Z of the helical spring 4. The spring core 5 has a conical taper and converges in a direction from the housing 1 towards the vibration-sensitive constructional unit 2. As a result of this, it is achieved that the radial clearance d in a radial direction r between the individual turns of the helical spring 4 and the spring core 5 increases in a direction from the housing 1 towards the vibration-sensitive constructional unit 2.

When the housing 1 is subjected to vibrations the turns of the helical spring 4, as the vibration amplitude increases, first come into contact with the conical spring core 5 in the proximity of the housing 1. As the vibration amplitude increases further an increasing number of turns of the helical spring 4 come into contact with the spring core 5. This results in a progressive damping of the vibrations of increasing vibration amplitude by means of the spring arrangements 3 and, consequently, in a progressive spring characteristic in radial directions r. Thus, the spring arrangements 3 have an overall progressive spring characteristic in all three directions in space.

In the case of excitation by vibrations of comparatively low frequency the vibration amplitudes of helical springs are larger than in the case of excitation by vibrations of comparatively high frequency. The required vibration clearance S should therefore be adapted to the lowest excitation frequencies that occur in operation. The electronic apparatus shown in FIG. 1 is preferably a CD or DVD apparatus intended for use in a motor vehicle. In a motor vehicle the mounting volume available for such an apparatus is intrinsically limited. As a result of the progressive spring characteristics of the spring arrangements 3 the vibration amplitude for the lowest vibration frequency, which dictates the mounting volume, is reduced, thereby allowing the vibration clearance S and thus the overall mounting volume for the housing 1 to be reduced in comparison with that for arrangements having linear spring characteristics.

Figure 3:
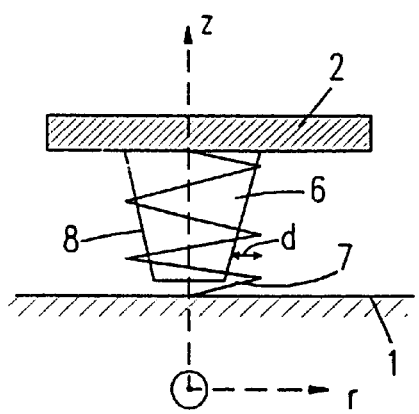
FIG. 3 shows a spring arrangement comprising a cylindrical helical spring having non-linearly spaced turns, a conical spring core secured to the vibration-sensitive constructional unit being disposed inside the cylindrical helical spring.

FIG. 3 shows an alternative spring arrangement 6 comprising a cylindrical helical spring 7. This spring arrangement 6 can also be used for the isolation between the housing 1 and the vibration-sensitive constructional unit 2 as shown in FIG. 1. The cylindrical spring 7 is fixedly mounted between the vibration-sensitive constructional unit 2 and the housing 1. A conical spring core 8 is arranged inside the cylindrical helical spring 7 but, instead of being fixed to the housing 1 as in the arrangement shown in FIG. 2, it is fixed to the vibration-sensitive constructional unit 2. The conical spring core 8 thus vibrates along with the vibration-sensitive constructional unit 2. The spring core 8 tapers down conically from the constructional unit 2 in accordance with the invention towards the housing 1. As a result of this, the radial clearance d in the direction r between the turns of the helical spring 7 and the conical spring core 8 decreases from the housing 1 towards the vibration-sensitive constructional unit 2. A consequence of this is that, when the vibration-sensitive constructional unit is subjected to vibrations, initially the turns of the helical spring 7 situated near the vibration-sensitive constructional unit 2 come into contact with the spring core 8. When the vibration amplitude increases further, the turns of the helical spring which are further away from the vibration-sensitive constructional unit 2 also come into contact with the spring core 8, which again results in a progressive spring characteristic and, consequently, in a progressive damping of the vibrations of the vibration-sensitive constructional unit 2 in the radial direction r. In the z direction the progressive spring characteristic of FIG. 2 is obtained in that the spacing between the individual turns of the helical spring 7 in the central portion of the helical spring 7 is larger than in the end portions of the helical spring 7. Thus, a progressive spring characteristic in all three directions in space is also obtained for the spring arrangement shown in FIG. 3.

Figure 4:
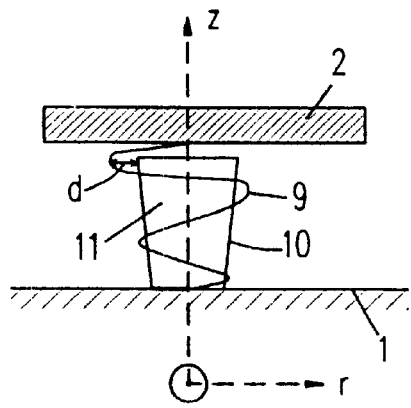
FIG. 4 shows a spring arrangement comprising a conical helical spring having non-linearly spaced turns, a conical spring core secured to the housing being disposed inside the conical helical spring.

Another alternative spring arrangement 11 for the isolation between the housing 1 and the vibration-sensitive constructional unit 2 shown in FIG. 1 is shown diagrammatically in FIG. 4. A conical helical spring 9 is interposed between the housing 1 and the vibration-sensitive constructional unit 2 and has one of its ends secured to the vibration-sensitive constructional unit 2 and its other end to the housing 1. The spacing between the turns of the conical helical spring 9 in the z direction is non-linear, which is achieved in that the spacing between the turns is made larger in the central portion of the conical helical spring 9 than in the end portions of the conical helical spring 9. The radial diameter in the radial direction r of the conical helical spring 9 decreases in a direction towards the housing 1, i.e. it is larger in the proximity of the vibration-sensitive constructional unit 2 than in the proximity of the housing 1. A conical spring core 10, secured to the housing 1, is arranged inside the conical helical spring 9. The conical spring core 10 tapers towards the housing 1. The degree of taper of the conical spring core 10 is such that the radial clearance d between the turns of the helical spring 9 and the spring core 10 increases from the housing 1 in a direction towards the vibration-sensitive constructional unit 2. This results in a progressive characteristic of the spring arrangement of FIG. 4 in the radial direction r. Thus, a progressive spring characteristic is obtained in all three directions in space.

Further spring arrangements having a wide variety of springs and spring cores are conceivable, which also lead to a progressive spring characteristic. The only essential feature for all possible spring arrangements is that the clearance between the turns of the helical spring and the spring core situated inside the helical spring is not constant, in such a manner that an increasing number of turns of the helical springs come into contact with the spring cores as the vibration amplitude of the vibration-sensitive constructional unit 2 increases.

What is claimed is:

1. An electronic apparatus, comprising:
    a housing;
    a vibration-sensitive constructional unit accommodated in the housing;
    damping means coupling the housing and the vibration-sensitive constructional unit and including at least one spring arrangement having a spring characteristic which is progressive in three directions.

2. The apparatus of claim 1, in which:
    the spring arrangement includes a helical spring having non-linearly spaced turns, and a spring core arranged inside the helical spring; and
    the helical spring and the spring core are constructed in such a manner that the radial clearance between turns of the helical spring and the spring core is not constant.

3. The apparatus of claim 2, in which:
    the spring core is secured to the housing; and
    the radial clearance between the turns of the helical spring and the spring core increases from the housing in a direction towards the vibration-sensitive constructional unit.

4. The apparatus of claim 2, in which:
    the spring core is secured to the vibration-sensitive constructional unit; and
    the radial clearance between the turns of the helical spring and the spring core decreases from the housing in a direction towards the vibration-sensitive constructional unit.

5. The apparatus of claim 2, in which the spring core is a tapered non-elastic body and the spring is a conical helical spring.

6. The apparatus of claim 2 wherein the spacing between individual turns in a central part of the helical spring is greater than in end parts of said helical spring.

7. The apparatus of claim 2 wherein the helical spring comprises a wire of constant diameter.

8. The apparatus of claim 2, in which the spring is a cylindrical helical spring having non-linearly space turns.

9. An electronic apparatus as claimed in claim 1 for use in a motor vehicle wherein
    the housing is adapted to be mounted in a dashboard of the motor vehicle, and;
    the vibration-sensitive constructional unit is accommodated in the housing.

10. The vehicle of claim 9, in which:
    the at least one spring arrangement includes multiple spring arrangements;
    wherein one spring arrangement includes a helical spring having non-linearly spaced turns and a spring core arranged inside the helical spring, and the spring core of the one spring arrangement is secured to the housing, and the radial clearance between the turns of the helical spring and the spring core increases from the housing in a direction towards the vibration-sensitive constructional unit;
    wherein another spring arrangement includes a helical spring having non-linearly spaced turns and a spring core arranged inside the helical spring, and the spring core of the other of the spring arrangements is secured to the vibration-sensitive constructional unit; and the radial clearance between the turns of the helical spring and the spring core decreases from the housing in a direction towards the vibration-sensitive constructional unit; and
    the spring characteristic of at least one of the multiple spring arrangements is progressive in three directions.

11. The apparatus of claim 1, in which:
    the at least one spring arrangement includes multiple spring arrangements;
    wherein one spring arrangement includes a helical spring having non-linearly spaced turns and a spring core arranged inside the helical spring, and the spring core of the one spring arrangement is secured to the housing, and the radial clearance between the turns of the helical spring and the spring core increases from the housing in a direction towards the vibration-sensitive constructional unit;
    wherein another spring arrangement includes a helical spring having non-linearly spaced turns and a spring core arranged inside the helical spring, and the spring core of the other spring arrangement is secured to the vibration-sensitive constructional unit; and the radial clearance between the turns of the helical spring and the spring core decreases from the housing in a direction towards the vibration-sensitive constructional unit; and
    the spring characteristic of each of the spring arrangements is progressive in three directions.

12. The apparatus of claim 1 wherein the spring arrangement includes a helical spring having non-linearly spaced turns, and a tapered spring core arranged inside the helical spring and secured to one of the housing and the vibration-sensitive constructional unit with a space between the other one of the housing and the vibration-sensitive constructional unit and a free end of the tapered spring core, and the radial clearance between turns of the helical spring and the spring core is not constant.

13. The apparatus of claim 12 wherein the spring core has a tapered conical configuration.

14. The apparatus of claim 1 wherein the spring characteristic of any one said spring arrangement is progressive in three directions in space so that vibrations which occur are damped progressively in all of said three directions.

15. The apparatus of claim 1 wherein:
    the spring arrangement includes a helical spring having non-linearly spaced turns, and a spring core arranged inside the helical spring, and
    the radial clearance between turns of the helical spring and the spring core is not constant such that an increasing number of turns of the helical spring come into contact with the spring core as the vibration amplitude of the vibration-sensitive constructional unit increases.

16. The apparatus of claim 1 wherein the at least one spring arrangement includes multiple spring arrangements; and each of the multiple spring arrangements has the spring characteristic which is progressive in said three directions in space.

17. The apparatus of claim 1 wherein the at least one spring arrangement includes multiple spring arrangements; and at least one of said multiple spring arrangements has the spring characteristic that is progressive in said three directions in space.

18. The electronic apparatus as claimed in claim 1 in which the at least one spring arrangement includes only one spring arrangement;

wherein the one spring arrangement includes a helical spring having non-linearly spaced turns, and a spring core arranged inside of the helical spring.

19. The electronic apparatus as claimed in claim 1 in which the at least one spring arrangement includes only one spring arrangement;

wherein the one spring arrangement has the spring characteristic which is progressive in said three directions.

20. The electronic apparatus as claimed in claim 19 wherein the one spring arrangement comprises a single helical spring and a spring core arranged inside of the helical spring.

21. An electronic device comprising:

a housing;

a vibration-sensitive constructional unit accommodated in the housing, including apparatus for reading information stored on an optical storage disc;

damping means coupling the housing and the vibration-sensitive constructional unit and including at least one spring arrangement having a spring characteristic which is progressive in three directions in space.

22. The device of claim 21 in which the device is adapted for playing CD or DVD recordings.

23. The device of claim 21 in which the device is adapted to be built into a motor vehicle.

24. The device of claim 21, in which:

the at least one spring arrangement includes multiple spring arrangements;

wherein one spring arrangement includes a helical spring having non-linearly spaced turns and a spring core arranged inside the helical spring, and the spring core of the one spring arrangement is secured to the housing, and the radial clearance between the turns of the helical spring and the spring core increases from the housing in a direction towards the vibration-sensitive constructional unit;

wherein another spring arrangement includes a helical spring having non-linearly spaced turns and a spring core arranged inside the helical spring, and the spring core of the other spring arrangement is secured to the vibration-sensitive constructional unit; and the radial clearance between the turns of the helical spring and the spring core decreases from the housing in a direction towards the vibration-sensitive constructional unit; and the spring characteristic of each of the spring arrangements is progressive in three directions.

* * * * *